(12) United States Patent
Pant et al.

(10) Patent No.: US 6,169,254 B1
(45) Date of Patent: Jan. 2, 2001

(54) THREE AXIS SENSOR PACKAGE ON FLEXIBLE SUBSTRATE

(75) Inventors: Bharat B. Pant, Minneapolis; Richard K. Spielberger, Maple Grove, both of MN (US)

(73) Assignee: Honeywell, Inc., Morristown, NJ (US)

( * ) Notice: Under 35 U.S.C. 154(b), the term of this patent shall be extended for 0 days.

(21) Appl. No.: 08/277,847

(22) Filed: Jul. 20, 1994

(51) Int. Cl.$^7$ ............................................. H05K 1/00
(52) U.S. Cl. ..................... 174/254; 174/260; 174/52.1; 324/247; 604/65
(58) Field of Search ..................... 174/254, 260, 174/117 F, 117 FF, 52.1, 52.2, 52.4, 52.3, 250; 439/67, 68, 77; 361/749, 811; 324/247; 600/381; 604/65, 66, 67

(56) References Cited

U.S. PATENT DOCUMENTS

| | | | |
|---|---|---|---|
| 4,792,879 | * 12/1988 | Bauknecht et al. | 361/749 X |
| 4,811,165 | * 3/1989 | Currier et al. | 361/716 |
| 4,928,206 | * 5/1990 | Porter et al. | 361/749 X |
| 4,990,948 | * 2/1991 | Sasaki et al. | 361/749 X |
| 5,012,316 | * 4/1991 | Silvermint | 257/417 |
| 5,159,751 | * 11/1992 | Cottingham et al. | 439/67 X |
| 5,220,488 | * 6/1993 | Denes | 361/749 |
| 5,265,322 | * 11/1993 | Fisher et al. | 439/657 X |
| 5,375,602 | * 12/1994 | Lancee et al. | 600/463 |
| 5,417,689 | * 5/1995 | Fine | 606/41 |
| 5,434,362 | * 7/1995 | Klosowiak et al. | 174/254 |
| 5,438,305 | * 8/1995 | Hikita et al. | 333/32 |
| 5,461,202 | * 10/1995 | Sera et al. | 174/254 |
| 5,484,404 | * 1/1996 | Schulman et al. | 604/66 |
| 5,520,178 | * 5/1996 | Dahn et al. | 600/368 |
| 5,644,230 | * 7/1997 | Pant et al. | 324/247 |

FOREIGN PATENT DOCUMENTS

| | | | |
|---|---|---|---|
| 9113744 | * | 1/1992 | (DE) . |
| 632275 | * | 6/1994 | (EP) . |
| 9523342 | * | 8/1995 | (WO) . |

* cited by examiner

Primary Examiner—Jeffrey Gaffin
Assistant Examiner—Kamand Cuneo
(74) Attorney, Agent, or Firm—Kris T. Fredrick

(57) ABSTRACT

Apparatus for mounting and making electrical connections to sensor devices for use in three axis sensing including a flexible circuit and a substrate shaped so that when a portion of the flexible tape is secured to the substrate the sensor devices can be mounted on the substrate for sensing in the desired three directions. The sensors are connected to conductors in the flexible tape by wirebonds or by other means.

16 Claims, 3 Drawing Sheets

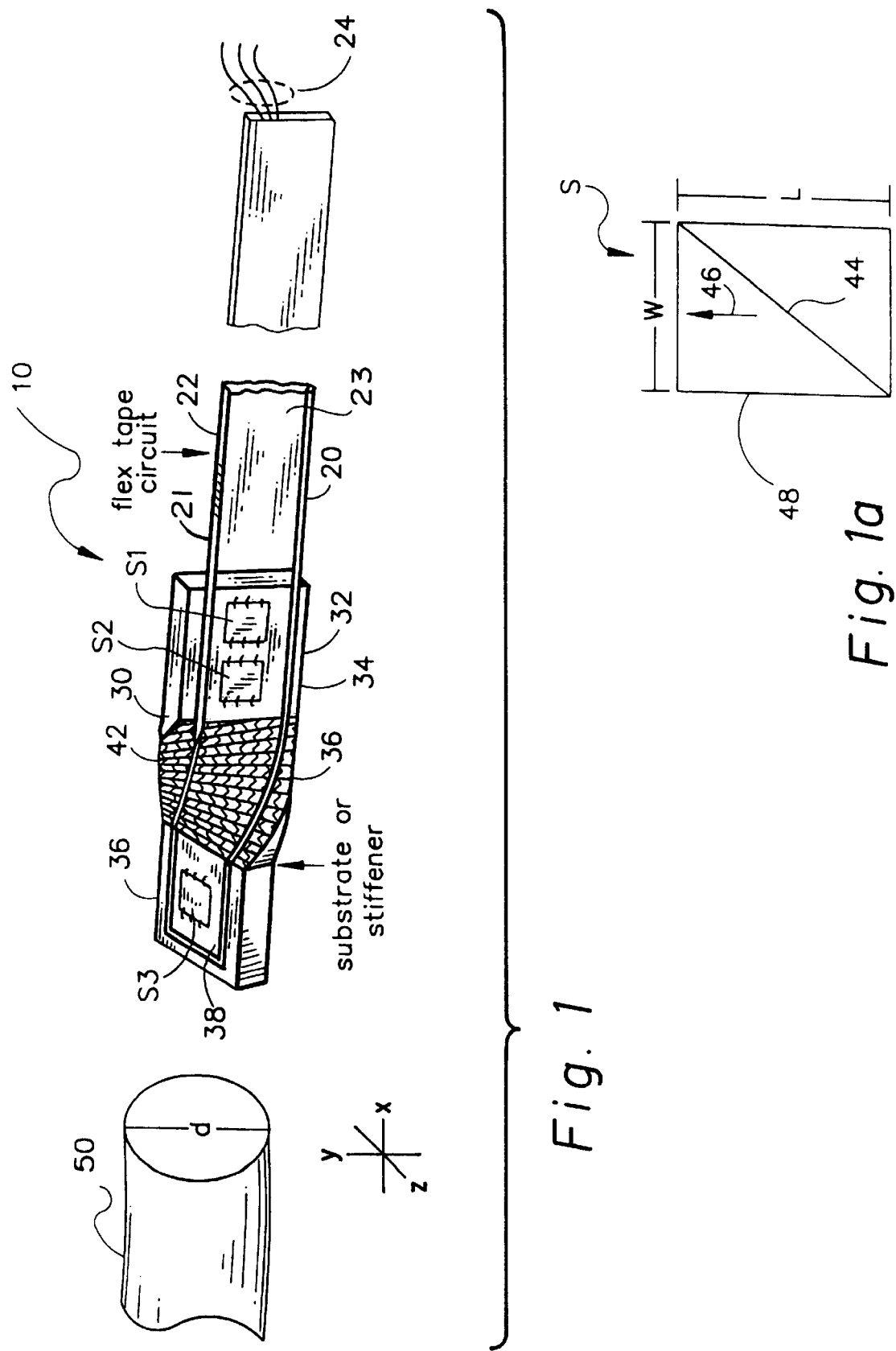

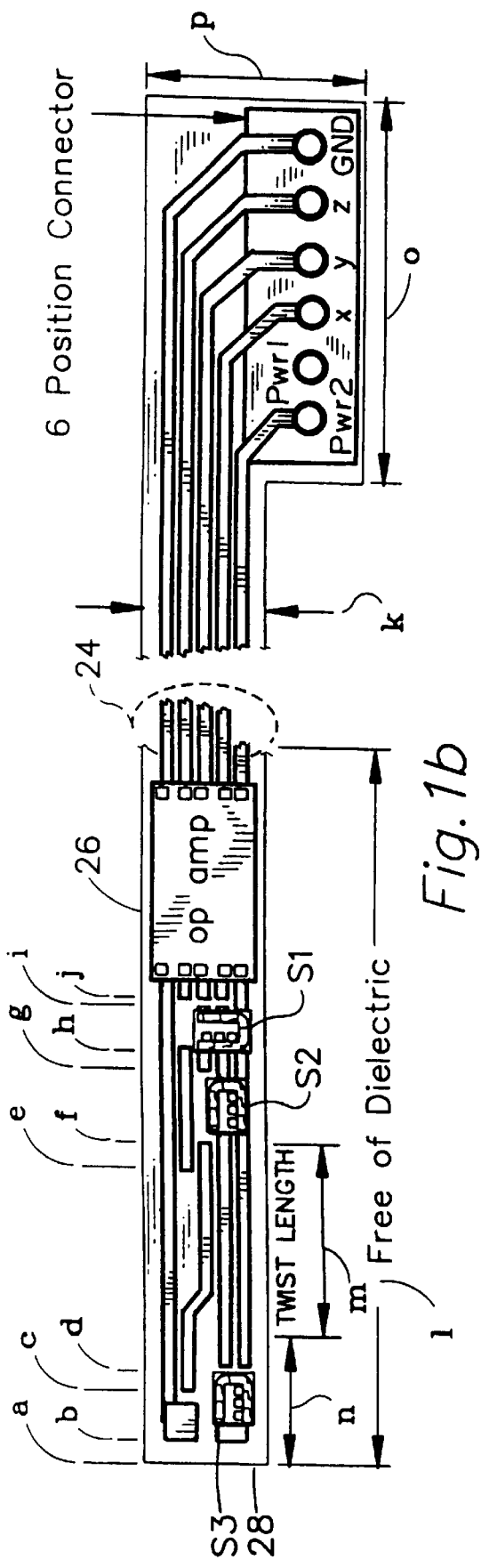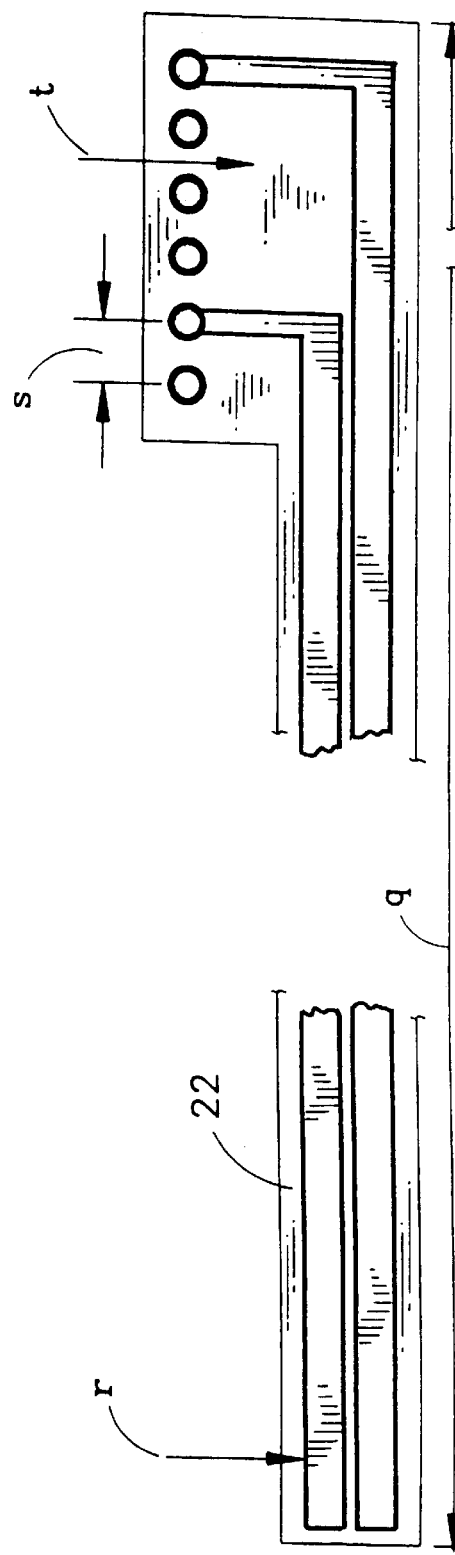
Fig.1b
Fig.1c

THREE AXIS SENSOR PACKAGE ON FLEXIBLE SUBSTRATE

BACKGROUND

The present invention relates generally to apparatus for mounting and making electrical connections to solid state sensors, which is typically referred to as packaging. The present invention relates specifically to the mounting and electrical connecting of sensors for the sensing of a condition occurring in mutually perpendicular planes which may be referred to as three axis sensing.

Three axis sensing is useful for determining the location and or orientation of a device which is carrying the apparatus and is moving in a known magnetic field created for the purpose of determining the location of the apparatus.

One application for such an apparatus is in the field of medical devices where miniaturized three axis sensing may be used in conjunction with a magnetic field having known characteristics to determine the location and orientation of a portion of a medical device.

In many medical devices, of which a catheter is one example, a three-axis sensing apparatus must be extremely small to be able to be inserted into a small channel or passageway within the device.

Thus a need exists for a three axis mounting and electrically connecting apparatus for sensing devices that can be inserted into a small elongated passageway.

SUMMARY OF THE INVENTION

The present invention solves these and other needs by providing an apparatus including an elongated flexible circuit having conductors and a substrate of a certain shape for providing a stiffness to the portion of the flexible circuit on which sensor devices are mounted. The substrate has a shape which includes a first portion having a surface lying in a plane which includes a desired first sensing direction and a desired second sensing direction for mounting a first and a second sensor. The substrate further includes a second portion having a surface lying in a plane which includes a desired third sensing direction. Sensor devices are electrically connected to the conductors of the flexible circuit by wire bonds or other means.

DESCRIPTION OF THE DRAWINGS

FIG. 1 shows a partial perspective view of an apparatus for mounting and electrically connecting sensor devices according to the present invention, with a portion of a passageway shown in phantom.

FIG. 1a is an outline drawing of a sensor device.

FIGS. 1b and 1c are plan views of a flexible electric circuit.

DETAILED DESCRIPTION

Figure 2:
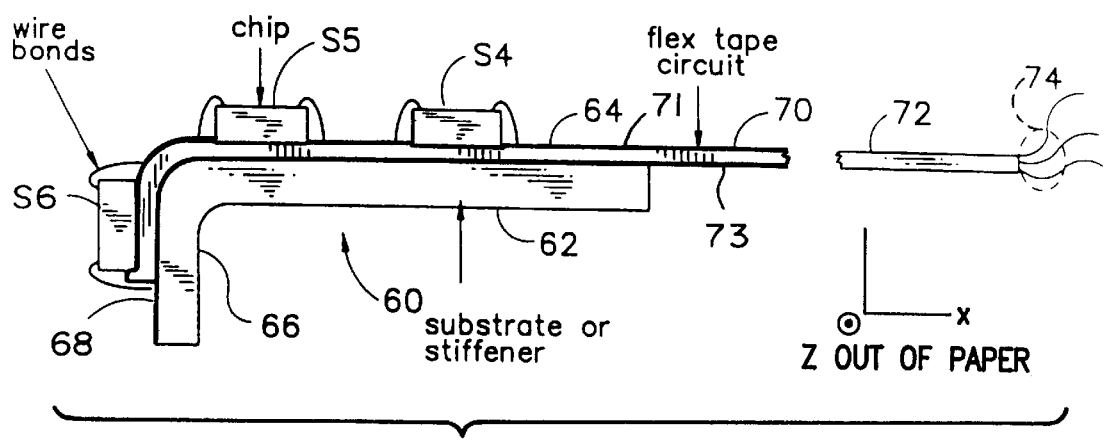
FIG. 2 is an elevation drawing of a first alternate embodiment.

An apparatus for mounting sensor devices for plural axis sensing and making electrical connections to the devices is shown in the drawings and generally designated 10. Apparatus 10 includes a flexible tape circuit 20 and substrate or stiffener 30.

As shown in FIG. 1 substrate 30 has a first portion 32 having a surface 34 lying in a plane as formed by the x-axis and the y-axis and a second portion 36 having a surface 38 lying in a plane formed by the x-axis and the z-axis. Substrate 30 has a transition portion 40 extending from first portion 32 and connecting to second portion 36 and having a surface 42. Transition portion 40 is in the form of a twist that rotates through 90 degrees. Substrate 30 is made from a formable metal material and provides a greater stiffness to a portion of flexible circuit 20. Materials that have been found to work include Aluminum or Beryllium Copper.

Flexible circuit 20 has surface 21 and surface 23 and includes dielectric 22 and conductors 24. Flexible circuit 20 has a portion of dielectric 22 bonded to surfaces 34, 38 and 42 of substrate 30. In FIG. 1 sensor device S1 at surface 34 is oriented to be sensitive along the y-axis and sensor device S2 is oriented to be sensitive along the x-axis. Sensor device S3 on surface 38 is oriented to be sensitive along the y-axis.

Flexible circuit 20 includes tape 22 and conductors 24. Surface 26 of flexible circuit 20 located near end 28 does not include dielectric and conductors 24 are exposed to allow electrical connections to be made. Flexible circuit 20 is typically made using a polyimide dielectric and copper conductors. Photolithography and etching processes are used in the fabrication. The construction of the flexible tape may be varied. Planar views of one satisfactory prototype are shown in FIGS. 1b and 1c, and a description of the materials and approximate dimensions is as follows:

DIELECTRIC MATERIAL=POLYIMIDE
WIDTH=0.076"
LENGTH=78.74"
POLYMIDE THICKNESS=0.002"
CONDUCTOR MATERIAL=COPPER
COPPER THICKNESS=0.0007"
EXPOSED COPPER PLATED WITH 20–40 MICROINCHES NICKEL
80 MICROINCHES WIREBONDABLE GOLD TO BE PLATED OVER NICKEL
COPPER LINE WIDTH TOP=0.005"
SPACE BETWEEN COPPER LINES ON TOP=0.005"
METALLIZATION TO EDGE CLEARANCE=0.0155"
COPPER WIDTH ON BOTTOM 2 BUSES=0.020" EACH
SPACE BETWEEN BUSES=0.005"
BOTTOM BUSES CONNECTED TO THE TOP LINES AS SHOWN WITH THRU VIAS
VIAS MAY BE FILLED WITH A CONDUCTIVE PASTE
BOTTOM SIDE TO BE COATED WITH A DIELECTRIC
TOP SIDE TO BE COATED WITH A DIELECTRIC EXCEPT FOR THE 0.600" TIP
CIRCUIT SENSOR END TO BE BONDED TO 0.006" THICK BERYLLIUM COPPER
ASSUME SENSOR CHIP SIZE 0.025"×0.035"
ALLOW 0.020" AROUND THE CHIP TO BRING OUT THE WIRE BONDS
EACH CHIP FOOTPRINT WILL THEN BE 0.065"×0.075"
OP AMP CHIP SIZE IS 0.063"×0.154"

In the prototype previously described the Beryllium Copper is 0.575" long before forming a 90 degree twist between the first and second 0.100" of the circuit after it is bonded to the beryllium copper.

An outline drawing of a sensor device S having a direction of sensitivity 46 and further having a length, l, a width, w, and a diagonal measurement 44, is shown in FIG. 1a. Sensors S are preferably of magnetoresistive material.

An advantage of the embodiment of FIG. 1 is that it accomplishes the three axis mounting of sensor devices in a way that allows apparatus 10 to be inserted in a passageway or orifice having a diameter measurement, d, that is less than diagonal measurement 44 of sensor device S. That is, the arrangement of FIG. 1 accomplishes the three axis sensing without presenting face 48 of sensor device S to the orifice or passageway 50. Unlike Hall-effect sensors which require the sensed field to be perpendicular to the plane of the sensor and therefore required a cube type of mounting, the sensor of the present invention are efficient in the cross-sectional area needed for mounting.

In a first alternate embodiment as illustrated in FIG. 2, substrate 60 is generally L shaped and includes leg 62, surface 64, leg 66 which is perpendicular to leg 62 and surface 68. Flexible circuit 70 has surface 71 and surface 73 and includes dielectric 72 and conductors 74. Flexible circuit 70 has a portion of dielectric 72 bonded to surface 64 and a portion of dielectric 72 bonded to surface 68. In this arrangement sensor device S4 could be oriented to be sensitive along the x-axis, and sensor device S5 could be oriented to be sensitive along the z-axis with both sensors lying in a common plane represented by the plane formed by the x-axis and the z-axis. Sensor device S6 is mounted to surface 68 of flexible tape and is oriented to be sensitive along the y-axis or to a condition in the plane formed by the y-axis and the z-axis. All sensor devices are electrically connected to flexible circuit 70 by, for example, wire bonds 75 between bonding pads on the sensor devices and conductors 74 in flexible circuit 70.

Figure 3:
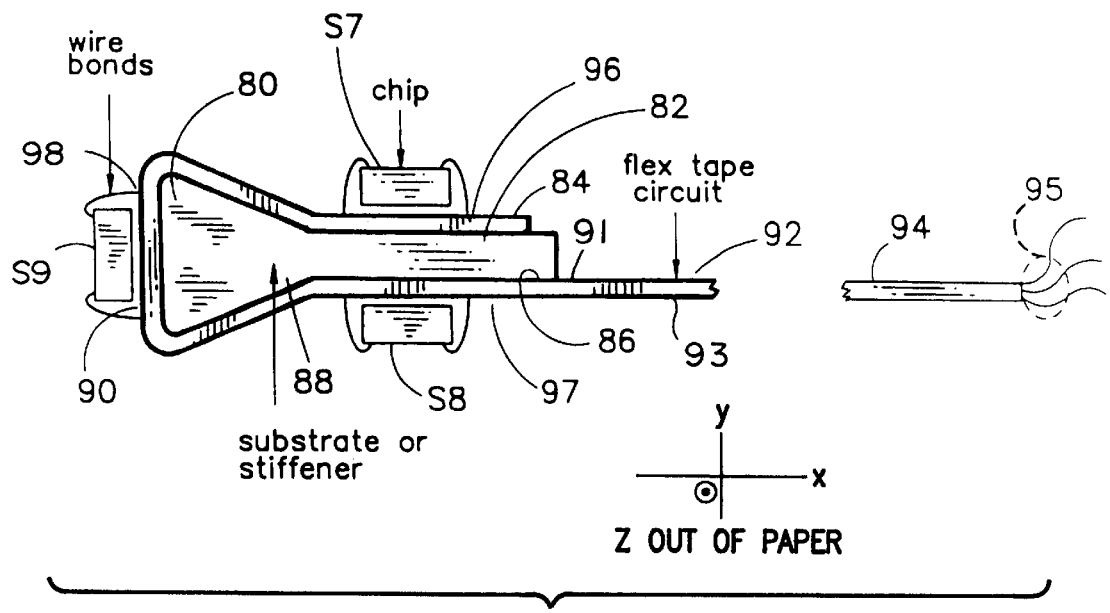
FIG. 3 is an elevation drawing of a second alternate embodiment.

In a second alternate embodiment, as shown in FIG. 3, substrate 80 has a cross section having a uniform thickness portion 82 that includes surface 84 and parallel surface 86. Tapered portion 88 has a thickness that increases in thickness in a direction going away from uniform thickness portion 82. Tapering portion 88 terminates in an end surface 90. Flexible circuit 92 has surface 91 and surface 93 and includes dielectric 94 and conductors 95. Flexible circuit 92 has portion 96 bonded to surface 84, portion 97 bonded to surface 86 and portion 98 bonded to surface 90. In FIG. 3 sensor device S7 at surface 84 is oriented to be sensitive along the x-axis and sensor device S8 at surface 86 is oriented to be sensitive along the z-axis. Sensor device S9 at surface 90 is oriented to be sensitive along the y-axis. An advantage of FIG. 3 is that sensor devices mounted on surfaces 84 and 86 do not contribute to the overall height of apparatus 10. The substrate of FIG. 3 is in the shape of an Erlenmeyer flask.

The electrical connection between the flexible circuit and the chips may be made by wire bonds, flip chip or tape-automated bonding. Commonly owned application entitled "Miniature Magnetometer" and having a filing date of Jul. 20, 1994 is hereby incorporated by reference.

We claim:

1. Apparatus having electrical connections to a plurality of sensor devices for sensing magnetic field components in a plurality of directions, with each said sensing device having a length, a width, a diagonal, and a sensing direction lying in a plane of each said sensing device, comprising:

an elongated flexible tape having a first surface, a second surface parallel to said first surface and conductors;

a substrate having a shape and stiffness greater than the stiffness of said flexible tape, a portion of said first surface secured to said substrate and conforming to at least a portion of said shape with a first portion of said second surface lying in a first plane which includes a desired first sensing direction;

a first sensor device mounted to said first portion;

a second portion of said second surface lying in a second plane which includes a desired second sensing direction, said second plane perpendicular to said first plane;

a second sensor device mounted to said second portion; and means for making said electrical connections between said sensor devices and said conductors, wherein the apparatus is configured to be inserted into an elongated passageway having a diameter smaller than an inch, wherein the diagonal of the sensor device is larger than the diameter of the passageway, and wherein the apparatus is formed in a device which is adapted to be movable in an induced magnetic field, thereby enabling the plurality of sensor devices to sense the magnetic field components.

2. Apparatus of claim 1 wherein said shape of said substrate includes a ninety degree bend.

3. Apparatus having electrical connections to a plurality of sensor devices for sensing magnetic field components in a plurality of directions, with each of said sensor devices having a sensing direction lying in a plane of each of said sensor devices, said apparatus with said sensor devices adapted for insertion into an elongated passageway, comprising:

an elongated flexible tape having a first surface, a second surface parallel to said first surface, and conductors;

a substrate having a shape and stiffness greater than the stiffness of said flexible tape, a portion of said first surface secured to said substrate and conforming to at least a portion of said shape with a first portion of said second surface lying in a first plane which includes a desired first sensing direction for mounting a first sensor device, and a second portion of said second surface lying in a second plane which includes a desired second sensing direction for mounting a second sensor device, said second plane perpendicular to said first plane, wherein said substrate comprises a first elongated portion having a first surface parallel to said first plane, and a second portion that tapers from narrow to wide in a direction away from said first portion and terminates in a second surface parallel to said second plane; and means for making said electrical connections between said sensor devices and said conductors.

4. Apparatus having electrical connections to a plurality of sensor devices for sensing magnetic field components in a plurality of directions, with each said sensing device having a sensing direction lying in a plane of each said sensing device, said apparatus with said sensor devices for insertion into an elongated passageway, comprising:

an elongated flexible tape having a first surface, a second surface parallel to said first surface, and conductors;

a substrate having a shape and stiffness greater than the stiffness of said flexible tape, a portion of said first surface secured to said substrate and conforming to at least a portion of said shape with a first portion of said second surface lying in a first plane which includes a desired first sensing direction for mounting a first sensor device, and a second portion of said second surface lying in a second plane which includes a desired second sensing direction for mounting a second sensor device, said second plane perpendicular to said first plane, wherein said substrate has a first planar portion having a third surface parallel to said first plane, a second planar portion having a fourth surface parallel to said second plane, and a planar twist portion extending between said first planar portion and said second planar portion; and means for making said electrical connections between said sensor devices and said conductors.

5. Apparatus having electrical connections to a plurality of sensor devices for sensing magnetic field components in a plurality of directions, with each of said sensor devices being planar and having a length, a width, a diagonal and a sensing direction lying in a plane of each of said sensor devices, comprising:

an elongated substrate having a first surface which includes a desired first direction of measurement and a desired second direction of measurement, a second surface including a desired third direction of measurement;

an elongated flexible tape having conductors, said flexible tape secured to said first surface and to said second surface with at least a first sensor device mounted to said flexible tape at said first surface for sensing in said desired first direction and at least a second sensor device mounted to said flexible tape at said second surface for sensing in said desired third direction; and means for making said electrical connections between said sensor devices and said conductors, wherein the apparatus is configured to be inserted into an elongated passageway having a diameter smaller than an inch, wherein the diagonal of the sensor device is larger than the diameter of the passageway, and wherein the apparatus is formed in a device which is adapted to be movable in an induced magnetic field, thereby enabling the plurality of sensor devices to sense the magnetic field components.

6. Apparatus of claim 5 wherein a third sensing device is mounted to said flexible tape at said first surface for sensing in said second desired direction.

7. Apparatus having electrical connections to first, second and third sensor devices for sensing magnetic field components in first, second and third mutually perpendicular directions, with each of said sensor devices being planar and having a length, a width, a diagonal, and a sensing direction lying in a plane of each of said sensor devices, comprising:

an elongated substrate having a first surface which includes said first and said second mutually perpendicular directions, a second surface which includes said third mutually perpendicular direction;

an elongated flexible tape having a width, and conductors, said flexible tape secured to said first surface and to said second surface with said first sensor device and said second sensor device mounted to said flexible tape at said first surface for sensing in said first and said second mutually perpendicular directions and said third sensor device mounted to said flexible tape at said second surface for sensing in said third mutually perpendicular direction; and means for making said electrical connections between said sensor devices and said conductors, wherein the apparatus is configured to be inserted into an elongated passageway having a diameter smaller than an inch, and wherein the apparatus is formed in a device which is adapted to be movable in an induced magnetic field, thereby enabling the first, second, and third sensor devices to sense the magnetic field components.

8. Apparatus of claim 7 wherein said first surface is located on a first substrate portion, said second surface is located on a second substrate portion and said substrate further comprises a 90 degree twist portion connecting said first substrate portion and said second substrate portion.

9. Apparatus of claim 8 wherein said means for making electrical connections is wirebond means.

10. Apparatus of claim 8 wherein each of said sensing devices has a length, a width and a diagonal measurement and said diagonal measurement is larger than said diameter.

11. Apparatus having electrical connections to first, second and third sensor devices for sensing magnetic field components in first, second and third mutually perpendicular directions, with each of said sensing devices being planar and having a sensing direction lying in a plane of each of said sensing devices, said apparatus with said sensor devices adapted for insertion into an elongated passageway having a diameter, comprising:

an elongated substrate having a first surface which includes said first and said second mutually perpendicular directions, a second surface which includes said third mutually perpendicular direction, and a twist connecting said first surface and said second surface;

an elongated flexible tape having a width, and conductors, said flexible tape secured to said first surface and to said second surface with said first sensor device and said second sensor device mounted to said flexible tape at said first surface for sensing in said first and said second mutually perpendicular directions and said third sensor device mounted to said flexible tape at said second surface for sensing in said third mutually perpendicular direction; and means for making said electrical connections between said sensor devices and said conductors.

12. Apparatus of claim 11 wherein each of said sensing devices has a length, a width and a diagonal measurement and said diagonal measurement is larger than said diameter.

13. Apparatus having electrical connections to a plurality of sensor devices for sensing magnetic field components in a plurality of directions, with each of said sensor devices being planar and having a length, a width, a diagonal and a sensing direction lying in a plane of each of said sensor devices, comprising:

an elongated substrate having a first surface which includes a desired first direction of measurement and a desired second direction of measurement, a second surface including a desired third direction of measurement, wherein said substrate has a 90 degree twist portion connecting said first surface and said second surface;

an elongated flexible tape having conductors, said flexible tape secured to said first surface and to said second surface with at least a first sensor device mounted to said flexible tape at said first surface for sensing in said desired first direction and at least a second sensor device mounted to said flexible tape at said second surface for sensing in said desired third direction; and means for making said electrical connections between said sensor devices and said conductors.

14. Apparatus having electrical connections to first, second and third sensor devices for sensing magnetic field components in first, second and third mutually perpendicular directions, with each of said sensor devices being planar and having a sensing direction lying in a plane of each of said sensor devices, comprising:

an elongated substrate having a first surface which includes said first and said second mutually perpendicular directions, a second surface which includes said third mutually perpendicular direction, wherein said first surface is located on a first substrate portion and said second surface is located on a second substrate portion, and wherein said substrate further comprises a 90 degree twist portion connecting said first substrate portion and said second substrate portion;

an elongated flexible tape having a width, and conductors, said flexible tape secured to said first surface and to said second surface with said first sensor device and said second sensor device mounted to said flexible tape at said first surface for sensing in said first and said second mutually perpendicular directions and said third sensor device mounted to said flexible tape at said second surface for sensing in said third mutually perpendicular direction; and means for making said electrical connections between said sensor devices and said conductors.

15. The apparatus of claim 14, wherein said means for making electrical connections is wirebond means.

16. The apparatus of claim 14, wherein each of said sensor devices has a length, a width, and a diagonal measurement, and wherein said diagonal measurement is larger than said diameter.

* * * * *